United States Patent
Kim et al.

(10) Patent No.: US 8,659,945 B2
(45) Date of Patent: Feb. 25, 2014

(54) NONVOLATILE MEMORY DEVICE AND METHOD OF OPERATING SAME

(75) Inventors: Seong Soo Kim, Hwaseong-si (KR); Yong seok Kim, Suwon-si (KR); Dong-Jun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 255 days.

(21) Appl. No.: 13/024,563

(22) Filed: Feb. 10, 2011

(65) Prior Publication Data
US 2011/0199828 A1 Aug. 18, 2011

(30) Foreign Application Priority Data
Feb. 12, 2010 (KR) .................. 10-2010-0013180

(51) Int. Cl.
*G11C 16/04* (2006.01)
(52) U.S. Cl.
USPC ............ 365/185.17; 365/185.02; 365/185.07; 365/185.18; 365/185.22; 365/185.23
(58) Field of Classification Search
USPC ............ 365/185.17, 185.23, 185.22, 185.18, 365/189.11, 185.2, 185.33, 185.27, 185.02, 365/185.07, 185.1, 185.11
See application file for complete search history.

(56) References Cited

U.S. PATENT DOCUMENTS

| 6,240,016 B1 | 5/2001 | Haddad et al. |
| 7,262,995 B2 | 8/2007 | Kim |
| 2004/0207003 A1* | 10/2004 | Kim et al. .................. 257/315 |
| 2006/0120172 A1* | 6/2006 | Lee et al. ................ 365/189.05 |
| 2008/0183951 A1* | 7/2008 | Lee et al. ..................... 711/103 |
| 2010/0091572 A1* | 4/2010 | Choi ....................... 365/185.18 |

FOREIGN PATENT DOCUMENTS

| JP | 2005025917 A | 1/2005 |
| KR | 1020050002245 A | 1/2005 |
| KR | 1020090048102 A | 5/2009 |

* cited by examiner

*Primary Examiner* — Pho M Luu
(74) *Attorney, Agent, or Firm* — Volentine & Whitt, PLLC

(57) ABSTRACT

A nonvolatile memory device comprises a bulk region and a plurality of memory cells connected to a source line and a plurality of wordlines. The method comprises applying a source line voltage to the source line with a first magnitude, applying a bulk voltage to the bulk region with a second magnitude lower than the first magnitude, and performing access operations on the plurality of memory cells while maintaining a substantially constant difference between the bulk voltage and the source line voltage.

17 Claims, 15 Drawing Sheets

NONVOLATILE MEMORY DEVICE AND METHOD OF OPERATING SAME

CROSS-REFERENCE TO RELATED APPLICATIONS

This application claims priority under 35 U.S.C. §119 to Korean Patent Application No. 10-2010-0013180 filed on Feb. 12, 2010, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices and methods of operating the nonvolatile memory devices.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random-access memory (SRAM) devices, dynamic random-access memory (DRAM) devices, and synchronous dynamic random-access memory (SDRAM) devices. Examples of nonvolatile memory devices include read-only memory (ROM) devices, programmable read-only memory (PROM) devices, electrically programmable read-only memory (EPROM) devices, electrically erasable and programmable read-only memory (EEPROM) devices, flash memory devices, phase-change random-access memory (PRAM) devices, magnetic random-access memory (MRAM) devices, resistive random-access memory (RRAM) devices, and ferroelectric random-access memory (FRAM) devices. Flash memory devices can be further divided into two categories including NOR-type flash memory devices and NAND-type flash memory devices.

A flash memory device typically comprises a memory cell array divided into a plurality of memory blocks. Each memory block is further divided into a plurality of pages. Data is programmed or read in the memory cell array in page units, and erased from the memory cell array in block units.

SUMMARY

According to one embodiment of the inventive concept, a method is provided for operating a nonvolatile memory device comprising a bulk region and a plurality of memory cells connected to a source line and a plurality of wordlines. The method comprises applying a source line voltage to the source line with a first magnitude, applying a bulk voltage to the bulk region with a second magnitude lower than the first magnitude, and while applying the bulk voltage to the bulk region, applying a select read voltage to a selected wordline among the plurality of wordlines and applying an unselect read voltage to unselected wordlines among the plurality of wordlines.

In certain embodiments, the bulk voltage is maintained at the same magnitude throughout a read operation.

In certain embodiments, the bulk voltage has a negative voltage level.

In certain embodiments, the source line is a common source line of multiple NAND flash strings, and a difference in magnitude between the source line voltage and the bulk voltage is between 0V and 1V.

In certain embodiments, the method further comprises determining whether to perform two consecutive read operations on the plurality of memory cells.

In certain embodiments, the method further comprises, upon determining to perform two consecutive read operations on the plurality of memory cells, maintaining a substantially constant voltage difference between the source line voltage and the bulk voltage during the two consecutive read operations.

According to another embodiment of the inventive concept, a method is provided for operating a nonvolatile memory device comprising a bulk region and a plurality of memory cells connected to a source line and a plurality of wordlines. The method comprises applying a source line voltage to the source line with a first magnitude, applying a bulk voltage to the bulk region with a second magnitude lower than the first magnitude, while applying the bulk voltage to the bulk region, applying a program voltage to a selected wordline among the plurality of wordlines and applying a pass voltage to an unselected wordline among the plurality of wordlines, and, while maintaining a substantially constant difference between the source line voltage and the bulk voltage, applying a verification voltage to the selected wordline and applying an unselect read voltage to the unselected wordlines.

In certain embodiments, the method further comprises determining whether selected memory cells connected to the selected wordline have achieved a target program state.

In certain embodiments, the method further comprises, upon determining that the selected memory cells have not achieved the target program state, applying a further program voltage to the selected wordline while maintaining the substantially constant difference between the source line voltage and the bulk voltage.

In certain embodiments, the method further comprises, upon determining that the selected memory cells have achieved the target program state, determining whether a next operation to be performed on the nonvolatile memory device is a program operation.

In certain embodiments, the method further comprises, upon determining that the next operation is a program operation, maintaining the substantially constant difference between the source line voltage and the bulk voltage during the next operation.

In certain embodiments, the source line is a common source line and the first magnitude corresponds to a ground voltage.

In certain embodiments, the substantially constant difference between the source line voltage and the bulk voltage is about 0.8V.

In certain embodiments, the nonvolatile memory device is a NAND flash memory device.

According to another embodiment of the inventive concept, a nonvolatile memory device comprises a memory cell array comprising a bulk region and a plurality of memory cells connected to a plurality of wordlines, a voltage generator that generates a bulk voltage to be applied to the bulk region and a source line voltage to be applied to a source line, wherein the bulk voltage is generated with a lower magnitude than the source line voltage, and a control logic circuit that controls the voltage generator to provide the bulk voltage to the bulk region before providing read voltages, program voltages, or verification voltages to the wordlines during respective read, program, or verification operations.

In certain embodiments, the control logic circuit controls the voltage generator to maintain a substantially constant difference between the source line voltage and the bulk voltage in consecutive read operations.

In certain embodiments, the control logic circuit controls the voltage generator to maintain a substantially constant difference between the source line voltage and the bulk voltage during repeated program and verification operations.

In certain embodiments, the control logic circuit controls the voltage generator to maintain a substantially constant difference between the source line voltage and the bulk voltage during transitions from read operations to program and verification operations, and during transitions from program and verification operations to read operations.

In certain embodiments, the source line is a common source line, the source line voltage is a ground voltage, and a voltage difference between the source line voltage and the bulk voltage is between 0V and 1V.

In certain embodiments, the memory cell array is a NAND type flash memory cell array.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, certain embodiments are described with reference to flash memory devices. However, embodiments of the inventive concept are not limited to flash memory devices and can take other forms, including other types of nonvolatile memory such as ROM, PROM, EPROM, EEPROM, MRAM, RRAM, PRAM, and FRAM.

Figure 1:
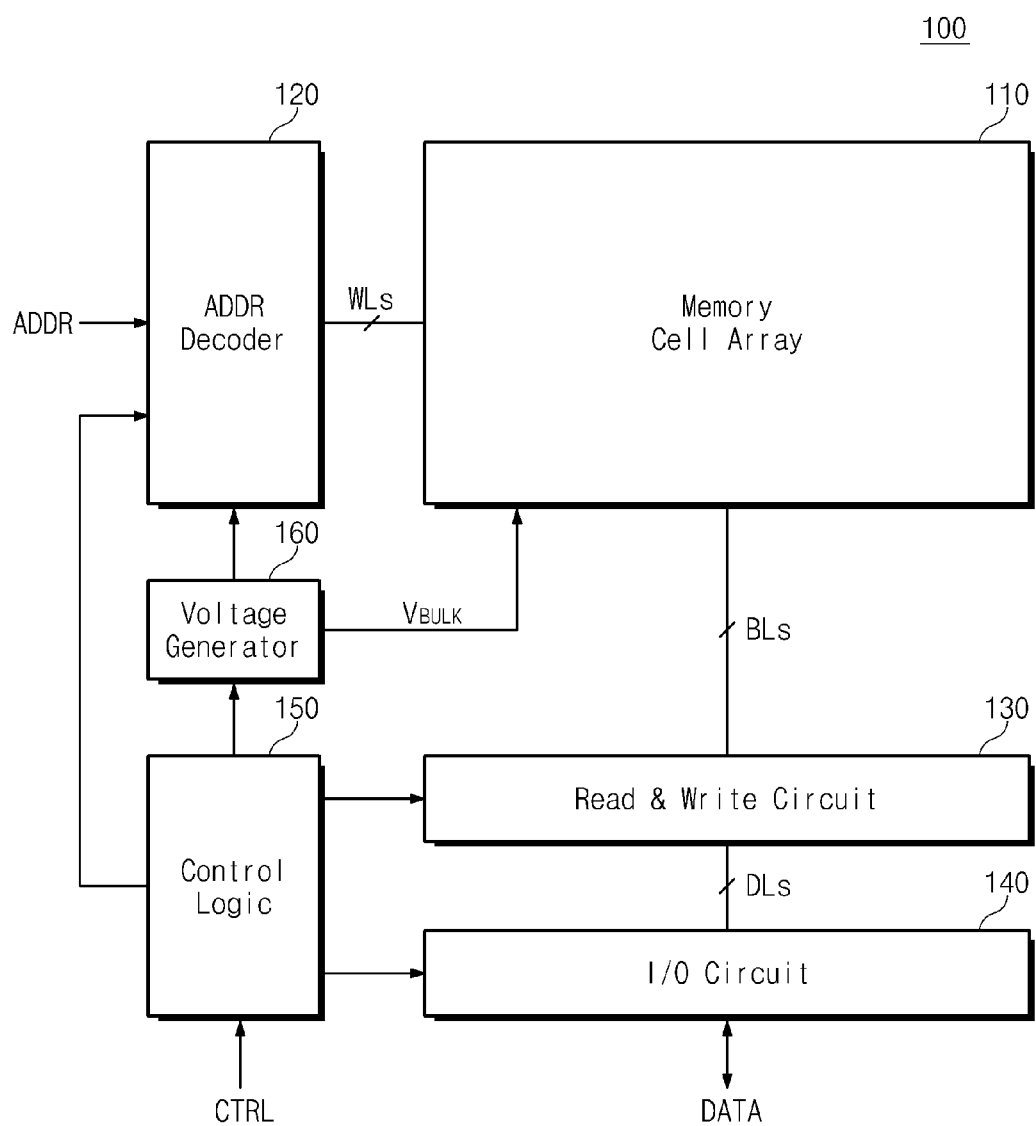
FIG. 1 is a block diagram illustrating a flash memory device according to an embodiment of the inventive concept.

FIG. 1 is a block diagram illustrating a flash memory device 100 according to an embodiment of the inventive concept. Referring to FIG. 1, flash memory device 100 comprises a memory cell array 110, an address decoder 120, a read/write circuit 130, a data input/output circuit 140, a control logic circuit 150, and a voltage generator 160.

Memory cell array 110 is connected to address decoder 120 through wordlines WLs and is connected to read/write circuit 130 through bit lines BLs. Memory cell array 110 comprises a plurality of memory cells arranged in a matrix. Data is written and read in the memory cells by selecting one or more wordlines using address decoder 120 and selecting one or more bit lines using read/write circuit 130.

Address decoder 120 operates under the control of control logic circuit 150. Address decoder 120 typically comprises an address buffer, a row address decoder, and a column address decoder. Address decoder 120 receives addresses ADDR from an external source and decodes a row address and a column address from the received addresses. Address decoder 120 selects wordlines WLs according to the decoded row address and provides the decoded column address to read/write circuit 130. Address decoder 120 also transfers wordline voltages from voltage generator 160 to wordlines WL according to the decoded row address. These wordline voltages can take various forms, such as a program voltage Vpgm, a pass voltage Vpass, a select read voltage Vrd, an unselect read voltage Vread, and a verification read voltage Vver.

Read/write circuit 130 is connected to memory cell array 110 through bit lines BLs and is connected to data input/output circuit 140 through data lines DLs. Read/write circuit 130 typically comprises a sense amplifier, a page buffer, and a column select circuit. Read/write circuit 130 operates under the control of control logic circuit 150. Read/write circuit 130 selects bit lines BLs according to the decoded column address transferred from address decoder 120.

Read/write circuit 130 receives data through data lines DLs and stores the received data in memory cell array 110. Read/write circuit 130 transfers data read from memory cell array 110 to data input/output circuit 140 through data lines DLs. Read/write circuit 130 can also write data read from a first storage region of memory cell array 110 into a second storage region of memory cell array 110 in a copy back operation.

Data input/output circuit 140 is connected to read/write circuit 130 through data lines DLs. Data input/output circuit 140 typically comprises a data buffer. Data input/output circuit 140 provides data DATA from an external source to read/write circuit 130. Data input/output circuit 140 also transfers data DATA from read/write circuit 130 to an external destination. Data input/output circuit 140 operates under the control of control logic circuit 150.

Control logic circuit 150 is connected to address decoder 120, read/write circuit 130, data input/output circuit 140, and voltage generator 160. Control logic circuit 150 controls various operations of flash memory device 100 and operates in response to control signals CTRL from an external source.

Voltage generator 160 generates program voltage Vpgm, pass voltage Vpass, select read voltage Vrd, unselect read voltage Vread, verification read voltage Vver, and a bulk voltage $V_{BULK}$ under the control of control logic circuit 150. Voltage generator 160 provides bulk voltage $V_{BULK}$ to a bulk region of memory cell array 110.

Figure 2:
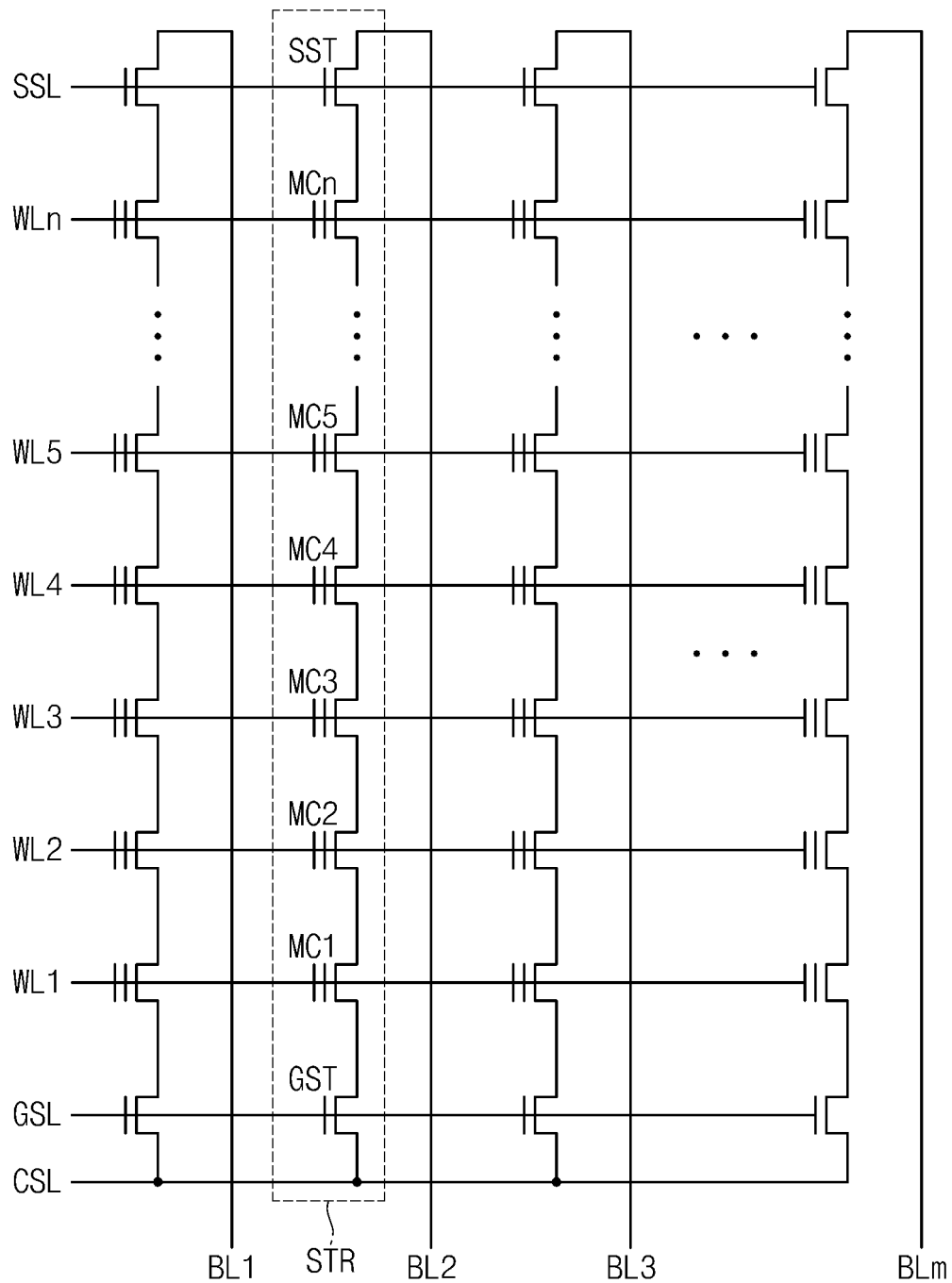
FIG. 2 is a circuit diagram illustrating a memory cell array of the flash memory device illustrated in FIG. 1.

FIG. 2 is a circuit diagram illustrating a memory cell array of the flash memory device illustrated in FIG. 1. For simplicity, FIG. 2 shows only one memory block among a plurality of memory blocks of memory cell array 110.

Referring to FIG. 2, memory cell array 110 comprises a plurality of strings STR. Each of strings STR comprises a string select transistor SST, a ground select transistor GST, and a plurality of memory cells MC1-MCn. Memory cells MC1-MCn are connected between string select transistor SST and ground select transistor GST.

Drains or sources of string select transistors SST are connected to corresponding bit lines BL1-BLm. Gates of string select transistors SST are connected to a string select line SSL. Sources or drains of ground select transistors GST are connected to a common source line CSL. Gates of ground select transistors GST are connected to a ground select line GSL. Control gates of memory cells MC1-MCn are connected to corresponding wordlines WL1-WLn.

Figure 3:
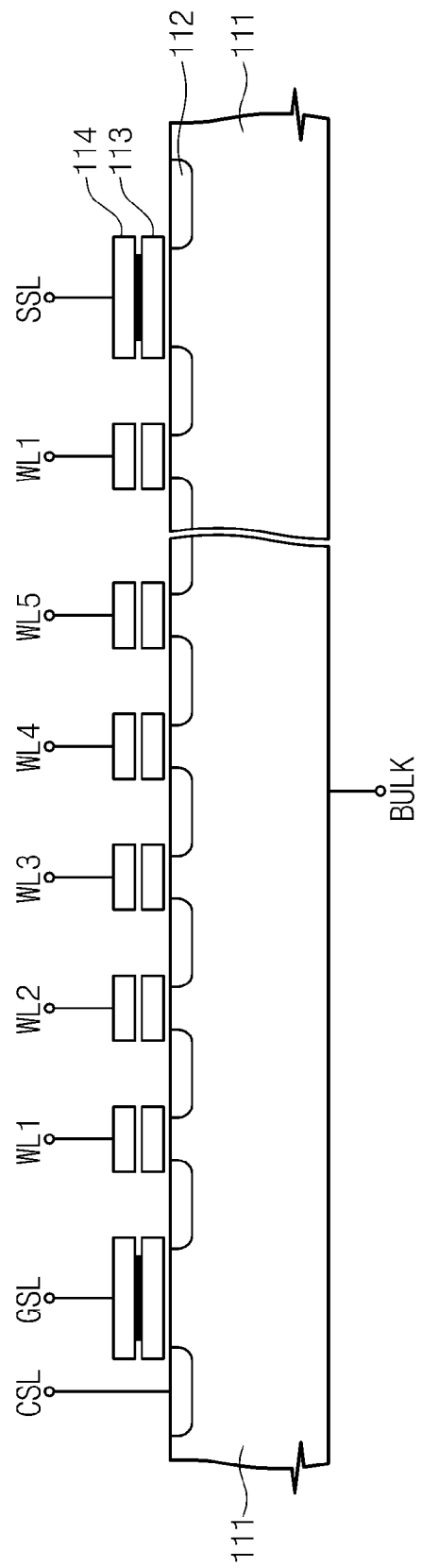
FIG. 3 is a cross sectional diagram of a string in the memory cell array of FIG. 2.

FIG. 3 is a cross sectional diagram of a string STR illustrated in FIG. 2. Referring to FIG. 3, string STR comprises a bulk region 111, drain or source regions 112, and gate structures disposed on bulk region 111 between the drain or source regions 112.

Bulk region 111 typically comprises a material such as polysilicon doped with p-type impurities. Drain or source regions 112 are disposed in bulk region 111, and each of the drain or source regions 112 is typically doped with n-type impurities.

Each gate structure comprises a floating gate 113, a control gate 114, and a tunnel insulating layer formed between bulk region 111 and floating gate 113. In each of select transistors SST and GST, the corresponding floating gate 113 and control gate 114 are connected to each other through a via hole. As a result, select transistors SST and GST operate like negative metal oxide semiconductor (NMOS) transistors.

Each string STR is connected to a corresponding bit line at a drain or source region of a corresponding string select transistor SST. The bit line typically comprises a conductor such as tungsten. Each string STR is also connected to a common source line CSL at a source or drain region of a corresponding ground select transistor GST. Common source line CSL typically comprises a conductor such as polysilicon.

In a read operation of memory cell array 110, address decoder 120 supplies an unselect read voltage Vread to string select line SSL and ground select line GSL. In addition, address decoder 120 supplies a select read voltage Vrd to a selected wordline and supplies unselect read voltage Vread to unselected wordlines.

In a program operation of memory cell array 110, address decoder 120 supplies a supply voltage Vcc to string select line SSL and supplies a ground voltage Vss to ground select line GSL. In addition, address decoder 120 transfers a program voltage Vpgm to a selected wordline and supplies a pass voltage Vpass to an unselected wordlines.

In a program verification operation of memory cell array 110, address decoder 120 supplies unselect read voltage Vread to string select line SSL and ground select line GSL. In addition, address decoder 120 supplies a verification read voltage Vver to a selected wordline and supplies unselect read voltage Vread to unselected wordlines.

In the above read, program, and verification operations, voltage generator 160 provides a bulk voltage $V_{BULK}$ lower than a common source line voltage $V_{CSL}$ to bulk region 111. For instance, assuming that common source line voltage $V_{CSL}$ provided to common source line CSL is a ground voltage Vss (e.g., 0V), bulk voltage $V_{BULK}$ is lower than ground (e.g., a negative voltage).

Where a negative bulk voltage $V_{BULK}$ is applied to bulk region 111 in a read or verification operation of a selected memory cell, a leakage current is prevented from flowing through bulk region 111, reducing a short channel effect. This can also increase the swing of a bit line current in response to an increase in a gate voltage of the selected memory cell, allowing the selected memory cell's threshold voltage to be judged more accurately. Where a negative bulk voltage $V_{BULK}$ is applied to bulk region 111 in a program operation of a selected memory cell, a threshold voltage of the selected memory cell increases, which can reduce the magnitude of a gate voltage required to program the selected memory cell.

Figure 4:
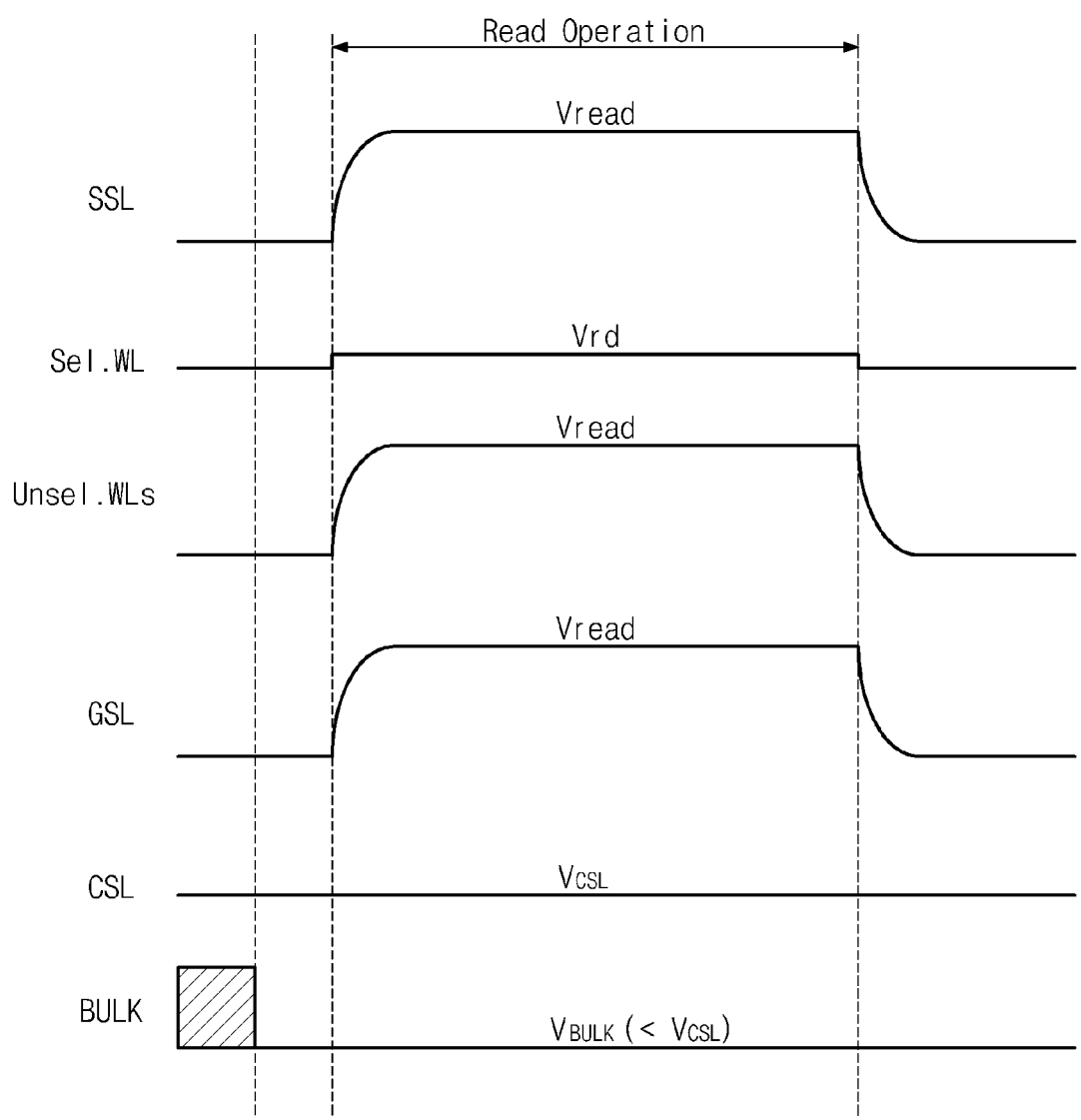
FIG. 4 is a timing diagram for a read operation of a flash memory device according to an embodiment of the inventive concept.

FIG. 4 is a timing diagram for a read operation of flash memory device 100 according to an embodiment of the inventive concept. Referring to FIG. 4, in the read operation, unselect read voltage Vread is applied to string select line SSL, unselected wordlines WLs, and ground select line GSL. Select read voltage Vrd is applied to a selected wordline WL.

Common source line voltage $V_{CSL}$ is applied to common source line CSL throughout the read operation. In the example of FIG. 4, common source line voltage $V_{CSL}$ is equal to ground voltage Vss, which is assumed to be 0V.

Bulk voltage $V_{BULK}$ is applied to bulk region 111 with a uniform value throughout the read operation. Bulk voltage $V_{BULK}$ is lower than common source line voltage $V_{CSL}$. Accordingly, in this example bulk voltage $V_{BULK}$ has a negative voltage level, such as −1V or −0.8V.

Where a read operation is performed after an erase operation, the voltage applied to bulk region 111 is changed from an erase voltage Vera to bulk voltage $V_{BULK}$ lower than common source line voltage $V_{CSL}$. Where a read operation is repeated or a performed after a program operation or verification operation, the voltage applied to bulk region 111 remains at bulk voltage $V_{BULK}$.

Figure 5:
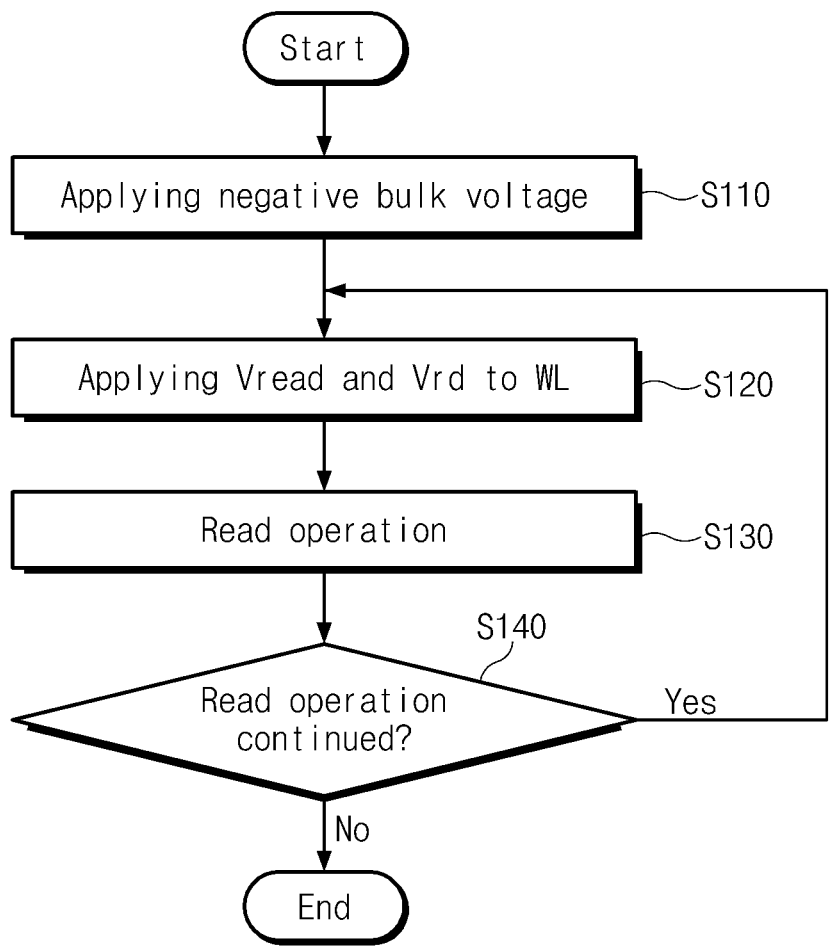
FIG. 5 is a flowchart illustrating a method of performing a read operation in a flash memory device according to an embodiment of the inventive concept.

FIG. 5 is a flowchart illustrating a method of performing a read operation in flash memory device 100 according to an embodiment of the inventive concept. In the description that follows, example method steps are indicated by parentheses (SXXX).

Referring to FIG. 5, before a read operation is performed, a bulk voltage $V_{BULK}$ lower than common source line voltage $V_{CSL}$ is applied to bulk region 111 (S110).

While bulk voltage $V_{BULK}$ is applied to bulk region 111, select read voltage Vrd is applied to a selected wordline and unselect read voltage Vread is applied to unselected wordlines (S120). Then, a read operation is performed on selected memory cells connected to the selected wordline (S130).

Upon completion of the read operation, control logic circuit 150 determines whether a next operation to be performed is a read operation (S140). Where the next operation is not a read operation (S140=No), the method ends. Otherwise (S140=Yes), address decoder 120 decodes a next row address under the control of control logic circuit 150 and selects another wordline according to the decoded next row address, and the method returns to step S120. Then, in the next operation, bulk voltage $V_{BULK}$, which is lower than common source line voltage $V_{CSL}$, is applied to bulk region 111. Accordingly, where multiple read operations are performed in succession, the same voltage is applied to bulk region 111 in each of the successive read operations.

Figure 6:
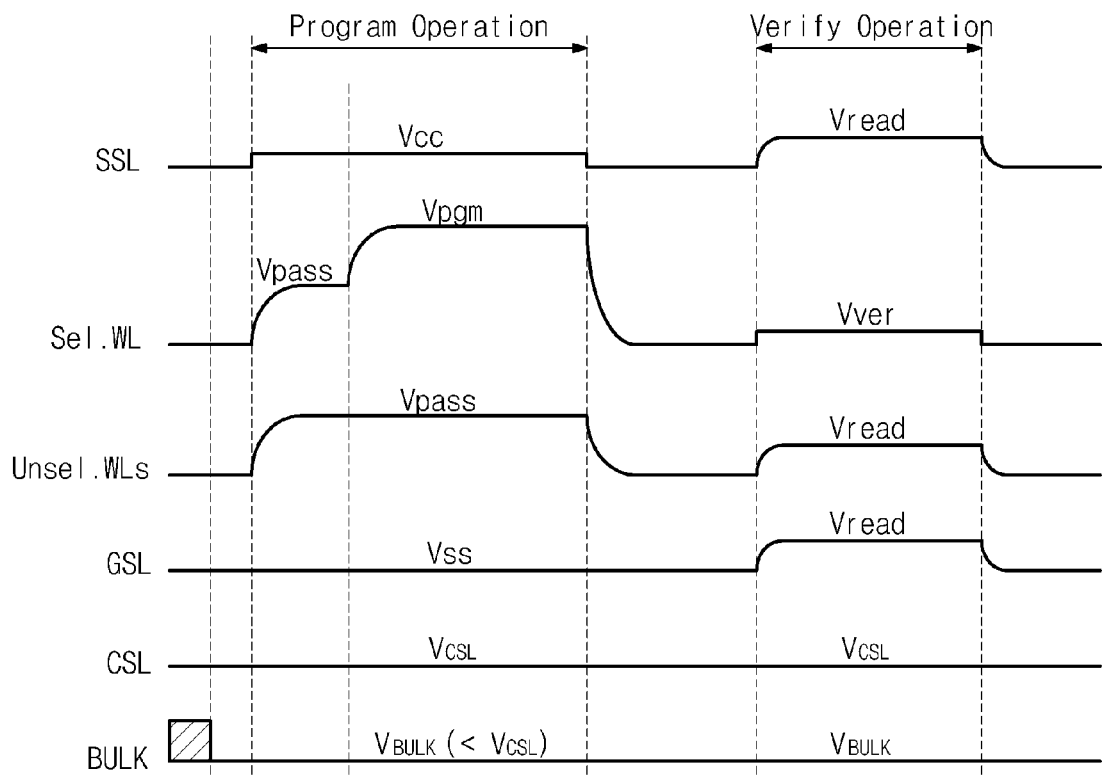
FIG. 6 is a timing diagram for a program operation and a verification operation of a flash memory device according to an embodiment of the inventive concept.

FIG. 6 is a timing diagram for a program operation and a verification operation of flash memory device 100 according to an embodiment of the inventive concept.

In the program operation, supply voltage Vcc is applied to string select line SSL, ground voltage Vss is applied to ground select line GSL, and pass voltage Vpass is applied to unselected wordlines WLs. Pass voltage Vpass and program voltage Vpgm are sequentially applied to a selected wordline WL.

In the verification operation, unselect read voltage Vread is applied to string select line SSL, unselected wordlines WLs, and ground select line GSL. Verification read voltage Vver is applied to the selected wordline WL.

Common source line voltage $V_{CSL}$ applied to common source line CSL maintains a uniform value during the program operation and the verification operation. In the example of FIG. 6, common source line voltage $V_{CSL}$ is equal to ground voltage Vss, which is assumed to be 0V.

Bulk voltage $V_{BULK}$ applied to bulk region 111 maintains a uniform level during the program operation and the verification operation. Bulk voltage $V_{BULK}$ has a lower voltage level than common source line voltage $V_{CSL}$. Accordingly, where common source line voltage $V_{CSL}$ is 0V, bulk voltage $V_{BULK}$ has a negative voltage level, such as −1V or −0.8V.

Where the program operation is performed after an erase operation, the voltage applied to bulk region 111 is changed from erase voltage Vera to bulk voltage $V_{BULK}$ having a lower level than common source line voltage $V_{CSL}$. Where the program operation and the verification operation are repeated, or a read operation is performed before the program operation and the verification operation, the voltage applied to bulk region 111 is not required to change for the program operation or verification operation.

Figure 7:
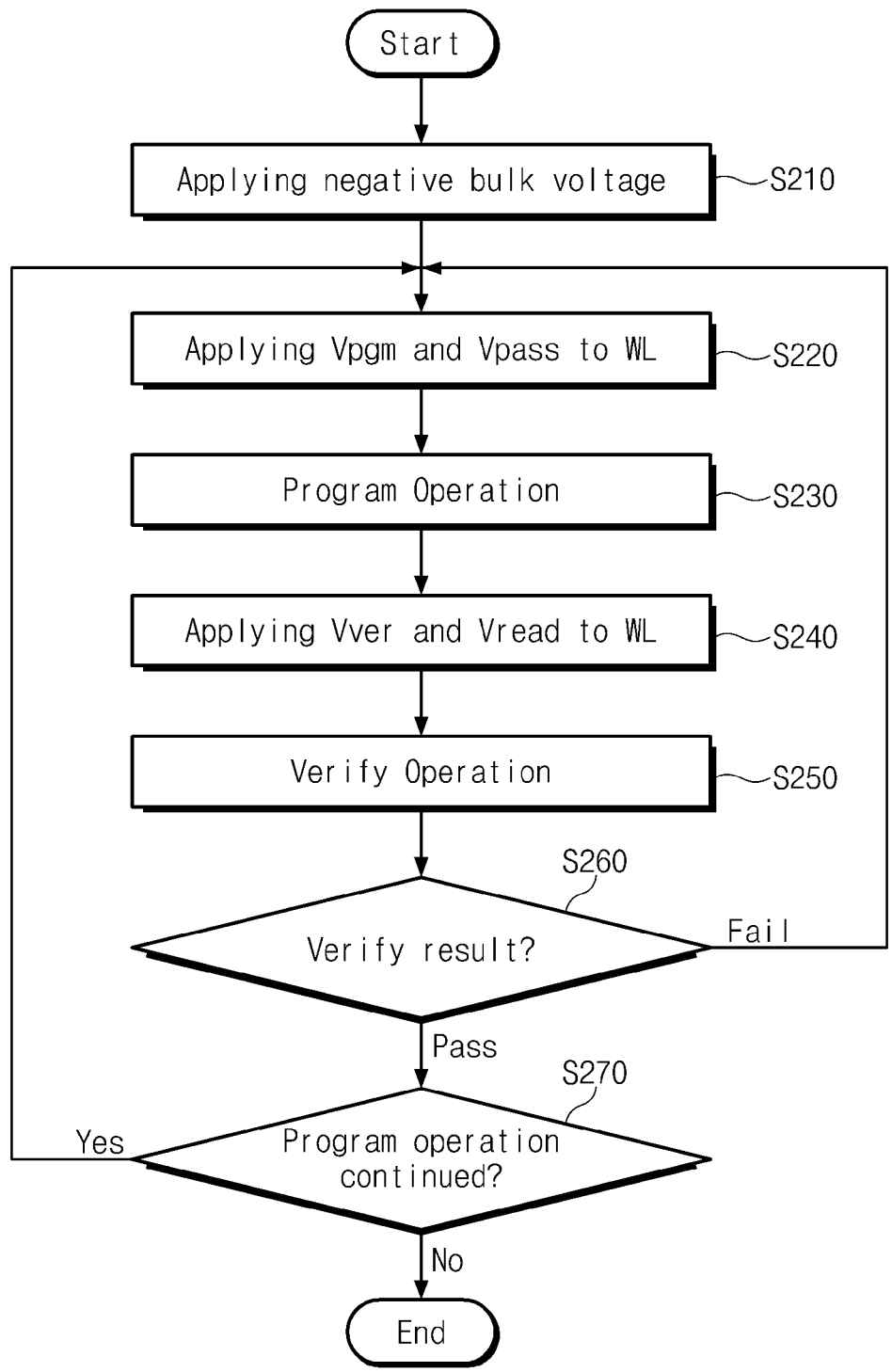
FIG. 7 is a flowchart illustrating a method of performing a program operation and a verification operation of a flash memory device according to an embodiment of the inventive concept.

FIG. 7 is a flowchart illustrating a method of performing a program operation and a verification operation of flash memory device 100 according to an embodiment of the inventive concept.

Referring to FIG. 7, before a program operation and a verification operation are performed, a bulk voltage $V_{BULK}$ lower than common source line voltage $V_{CSL}$ is applied to bulk region 111 (S210). At the same time, a program voltage Vpgm is applied to a selected wordline, and pass voltage Vpass is applied to unselected wordlines (S220). Thereafter, a program operation is performed on a memory cell connected to the selected wordline (S230).

Upon completion of the program operation, verification voltage Vver is applied to the selected wordline and unselect read voltage Vread is applied to the unselected wordlines (S240). Then, a verification operation is performed on a programmed memory cell (S250).

Next, control logic circuit 150 determines whether the programmed memory cell is program-passed or program-failed according to a verification result of step S250 (S260). Where the programmed memory cell is determined to be program-failed (S260=Fail), the method repeats steps S220-S260. Otherwise (S260=Pass), control logic circuit 150 determines whether a next operation to be performed is a program operation (S270). Where the next operation is not a program operation (S270=No), the method ends. Otherwise (S270=Yes), address decoder 120 decodes a new row address in response to control logic circuit 150 and selects wordlines according to the decoded new row address. Then, the method returns to step S220 and performs operations S220-S270 according to the decoded new row address.

In the example of FIG. 7, bulk voltage $V_{BULK}$ is lower than common source line voltage $V_{CSL}$. In program and verification operations performed repeatedly, the same level of bulk voltage $V_{BULK}$ is applied to a bulk region of selected memory cells.

As indicated by the foregoing, in read, program, and verification operations where bulk voltage $V_{BULK}$ is lower than common source line voltage $V_{CSL}$, a leakage current is prevented from flowing through the bulk region of a selected memory cell, reducing a short channel effect. In addition, in verification operations, a slope of a bit line current characteristic curve increases, allowing a boundary of a threshold voltage to be judged with greater accuracy and leading to more accurate formation of threshold voltage distributions. Moreover, in program operations, the amplitude of program voltages can be lowered according to a threshold voltage increase created by the lowered bulk voltage $V_{BULK}$.

Figure 8:
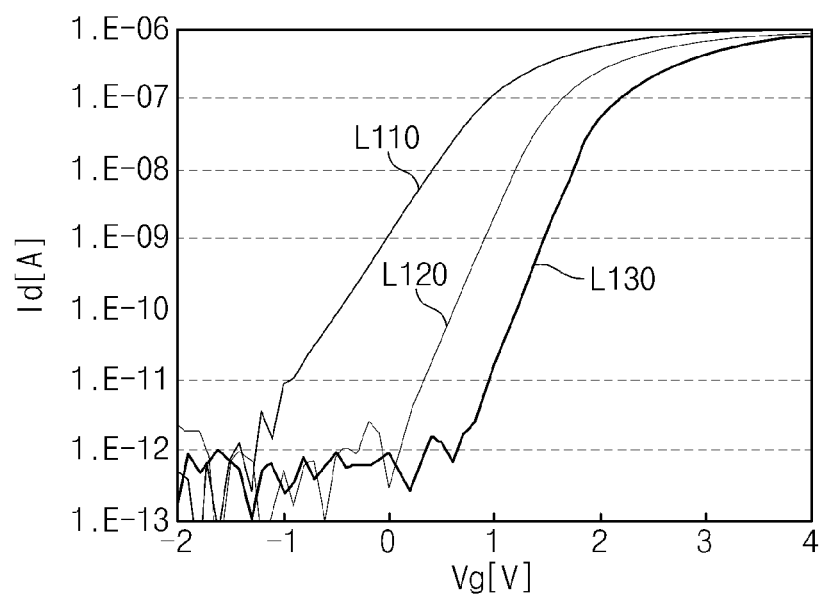
FIG. 8 is a graph showing a relationship between a bit line current and a wordline voltage in experimental data obtained from different flash memory devices.

FIG. 8 is a graph showing a relationship between a bit line current and a wordline voltage in experimental data obtained from different flash memory devices. More particularly, FIG. 8 shows a characteristic curve of a bit line current Id relative to a wordline voltage Vg. A first line L110 corresponds to a first flash memory device where bulk voltage $V_{BULK}$ is the same as common source line voltage $V_{CSL}$. A second line L120 corresponds to a second flash memory device where bulk voltage $V_{BULK}$ is 1V lower than common source line voltage $V_{CSL}$. A third line L130 corresponds to a third flash memory device where bulk voltage $V_{BULK}$ is 2V lower than common source line voltage $V_{CSL}$.

For the same value of bit line current Id, wordline voltages Vg of second and third lines L120 and L130 are higher than a wordline voltage Vg of first line L110, indicating that decreasing bulk voltage $V_{BULK}$ relative to common source line voltage $V_{CSL}$ can increase an effective threshold voltage of selected memory cells. In addition, slopes of second and third lines L120 and L130 are steeper than a slope of first line L110, indicating that a boundary of a threshold voltage can be more accurately judged in the second and third flash memory devices. As a result, threshold voltage distributions can be controlled with greater accuracy in the second and third flash memory devices.

Figure 9:
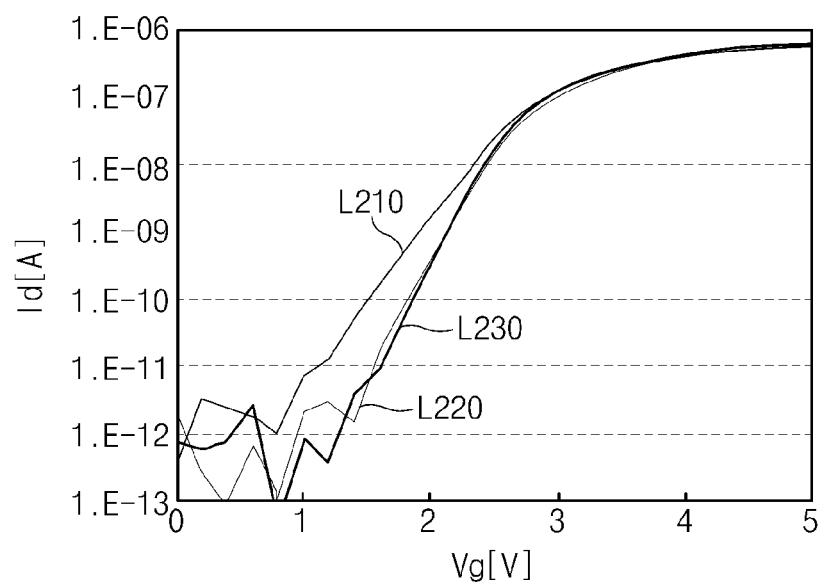
FIG. 9 is a graph showing a relationship between a bit line current and a wordline voltage in experimental data obtained from different flash memory devices.

FIG. 9 is a graph showing a relationship between a bit line current and a wordline voltage in experimental data obtained from different flash memory devices. More particularly, FIG. 9 shows a characteristic curve of a bit line current Id relative to a wordline voltage Vg where a threshold voltage is set to 3V. The threshold voltage is defined as a wordline voltage Vg required to produce a bit line current Id of 100 nA.

A first line L210 corresponds to a first flash memory device where bulk voltage $V_{BULK}$ is the same as common source line voltage $V_{CSL}$. A second line L220 corresponds to a second flash memory device where bulk voltage $V_{BULK}$ is 1y lower than common source line voltage $V_{CSL}$. A third line L230 corresponds to a third flash memory device where bulk voltage $V_{BULK}$ is 2V lower than common source line voltage $V_{CSL}$.

As indicated by FIG. 9, when a memory cell is programmed to a particular threshold voltage, second and third lines L220 and L230 have steeper slopes than first line L210, indicating that a threshold voltage can be judged more accurately where bulk voltage $V_{BULK}$ is lower than common source line voltage $V_{CSL}$. Consequently, reducing bulk voltage $V_{BULK}$ relative to common source line voltage $V_{CSL}$ can improve the accuracy of verification operations of selected memory cells.

Figure 10:
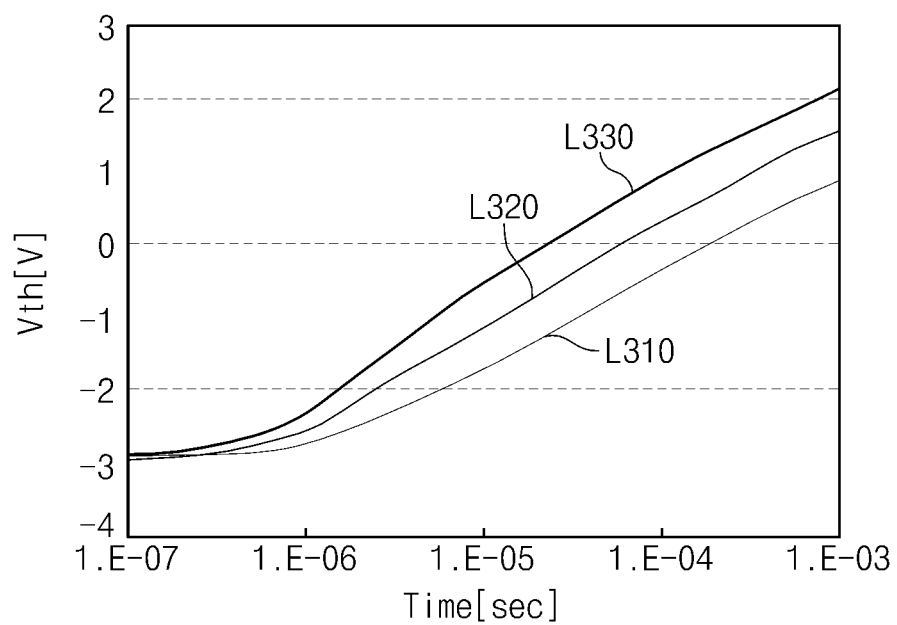
FIG. 10 is a graph showing a relationship between threshold voltages and programming times in experimental data obtained from different flash memory devices.

FIG. 10 is a graph illustrating a relationship between threshold voltages and programming times in experimental data obtained from different flash memory devices. More particularly, FIG. 10 illustrates a threshold voltage Vth of a selected memory cell as a function of a program time Time.

A first line L310 corresponds to a first flash memory device where bulk voltage $V_{BULK}$ is the same as common source line voltage $V_{CSL}$. A second line L320 corresponds to a first flash memory device where bulk voltage $V_{BULK}$ is 1V lower than common source line voltage $V_{CSL}$. A third line L330 corresponds to a first flash memory device where bulk voltage $V_{BULK}$ is 2V lower than common source line voltage $V_{CSL}$.

Slopes of second and third lines L320 and L330 are steeper than a slope of first line L310 at the same values of program time Time. This indicates that where bulk voltage $V_{BULK}$ is applied to the bulk region with a lower level than common source line voltage $V_{CSL}$, the speed of programming operations tends to increase, and a lower program voltage can be used to program selected memory cells.

The above-described flash memory devices can be incorporated into various products. For example, they can be incorporated into electronic devices such as personal computers, digital cameras, camcorders, cellular phones, personal media players, gaming devices, personal digital assistants, memory cards, USB memories, solid state drives, and many others.

Figure 11:
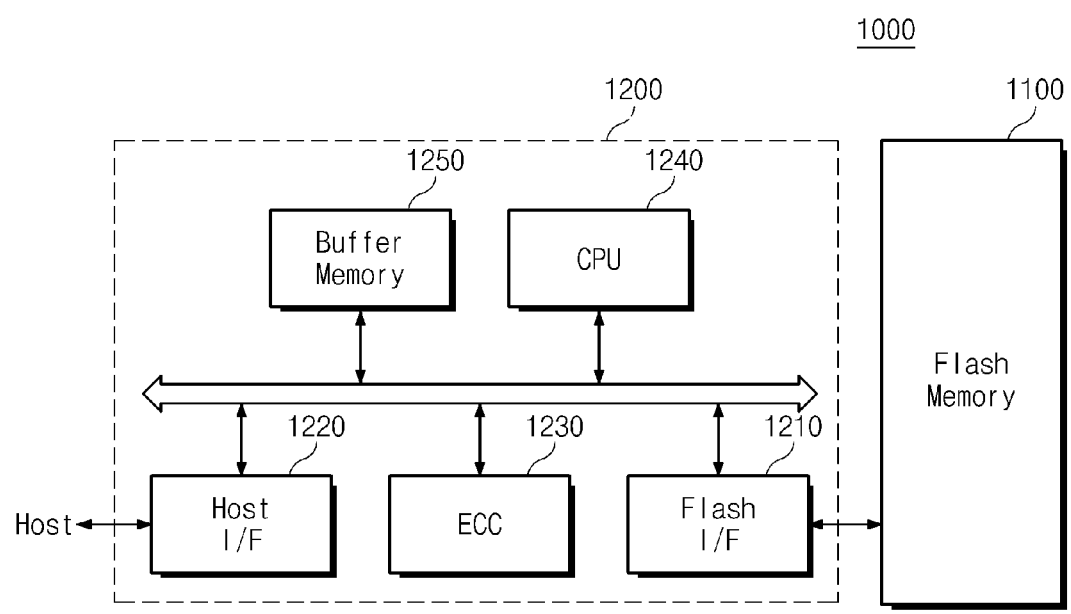
FIG. 11 is a block diagram illustrating a memory system comprising a flash memory device according to an embodiment of the inventive concept.

FIG. 11 is a block diagram illustrating a memory system 1000 comprising a flash memory device according to an embodiment of the inventive concept.

Referring to FIG. 11, memory system 1000 comprises a flash memory device 1100 and a memory controller 1200.

Flash memory device 1100 and memory controller 1200 can be included in a single storage device. For example, flash memory device 1000 can be included in a portable storage device such as a universal serial bus memory, or a memory card such a multimedia card, a secure digital card, an extreme digital card, a compact flash card, or a subscriber identity module card. Flash memory device 1100 and memory controller 1200 can also be connected to a host such as a computer, a notebook, a digital camera, a cellular phone, an MP3 player, a PMP, or a gaming machine.

Flash memory device 1100 performs read, program, verification, and erase operations under the control of memory controller 1200. Flash memory device 1100 applies a bulk voltage $V_{BULK}$ lower than a common source line voltage $V_{CSL}$ to a bulk region to perform read, program, and verification operations.

Memory controller 1200 comprises a flash interface 1210, a host interface 1220, an ECC circuit 1230, a central processing unit (CPU) 1240, and a buffer memory 1250.

Flash interface 1210 is used to exchange commands, addresses, and data with flash memory device 1100. Flash interface 1210 provides read commands and addresses for read operations, and provides write commands, addresses, and data for write operations. Host interface 1220 receives requests for read or write operations from a host and provides data in response to requests from the host.

ECC circuit 1230 generates error correction code (ECC) data, such as a parity bit, from data transmitted to flash memory device 1100. The ECC data is stored in a spare area of flash memory device 1100. ECC circuit 1230 detects an error in data read from flash memory device 1100. Where the detected error is within a correctable range, ECC circuit 1230 corrects the detected error. ECC circuit 1230 can be located inside memory controller 1200 or outside memory controller 1200 in various alternative embodiments.

CPU 1240 is configured to control read and write operations of flash memory device 1100 in response to requests from the host. Buffer memory 1250 temporarily stores data read from flash memory device 1100 or data provided from the host. Buffer memory 1250 can be used to store firmware such as a flash translation layer for operating CPU 1240. Buffer memory 1250 typically comprises a DRAM or an SRAM.

Buffer memory 1250 can also store table information to manage read error information. The table information comprises metadata and is stored in a meta area of flash memory device 1100 under the control of CPU 1240. The table information is copied from the meta area to buffer memory 1250 upon power-up of memory system 1000. Although not illustrated in the drawing, memory system 1000 can further comprise a ROM for storing code data for interfacing with the host.

Figure 12:
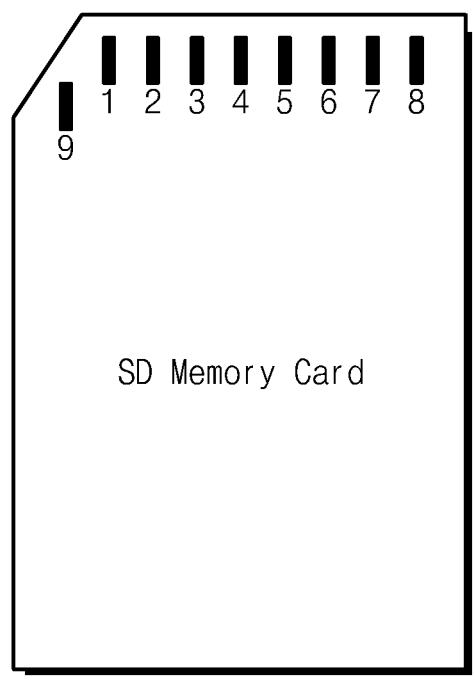
FIG. 12 is a block diagram illustrating a memory card comprising a flash memory device according to an embodiment of the inventive concept.

FIG. 12 is a block diagram illustrating a memory card comprising a flash memory device according to an embodiment of the inventive concept. More particularly, FIG. 12 illustrates an SD memory card.

Referring to FIG. 12, the SD card comprises nine pins. The SD card comprises four data pins 1, 7, 8, and 9, one command pin 2, one clock pin 5, and three power supply pins 3, 4, and 6.

Command and response signals are transmitted through command pin 2. In general, the command signals are transmitted from a host to the SD card, and the response signals are transmitted from the SD card to the host.

In certain embodiments, the SD card of FIG. 12 incorporates memory system 1000 of FIG. 11. In such embodiments, a bulk voltage $V_{BULK}$ lower than a common source line voltage $V_{CSL}$ is applied to a bulk region of flash memory device 1100 during various operations as described above.

Figure 13:
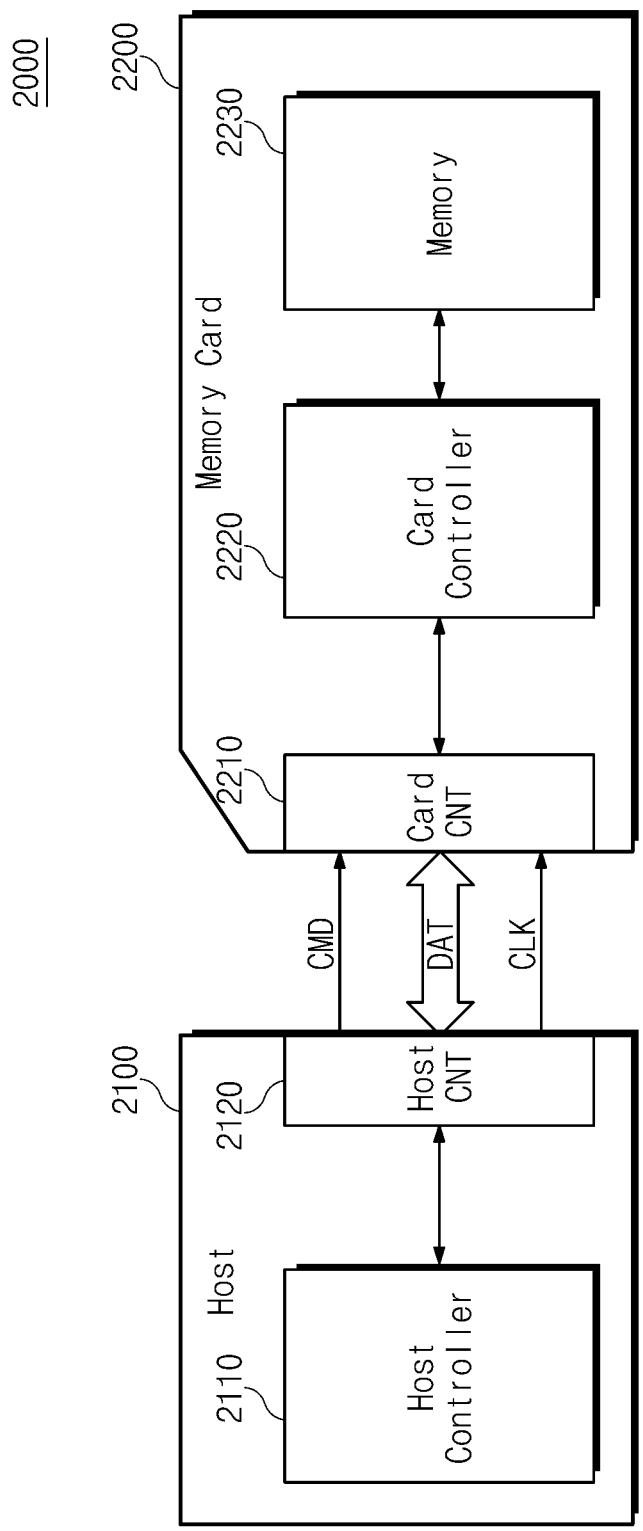
FIG. 13 is a block diagram illustrating an internal structure of the memory card of FIG. 12 and a connection between a host and the memory card.

FIG. 13 is a block diagram illustrating an internal structure of the SD card of FIG. 12 and a connection between a host and the memory card.

Referring to FIG. 13, a memory card system 2000 comprises a host 2100 and a memory card 2200. Host 2100 comprises a host controller 2110 and a host connection unit 2120. Memory card 2200 comprises a card connection unit 2210, a card controller 2220, and a memory 2230.

Host connection unit 2120 comprises a plurality of pins. These pins comprise a command pin, a data pin, a clock pin, and a power supply pin. The number of pins varies with the type of memory card 2200. For instance, an SD card comprises nine pins.

Host 2100 writes data in memory card 2200 or reads data stored in memory card 2200. Host controller 2110 transmits a command CMD, a clock signal CLK generated from a clock generator in host 2100, and data DAT to memory card 2200 through host connection unit 2120.

Card controller 2220 stores data in memory 2230 in response to a write command received through card connection unit 2210. Memory 2230 stores data transmitted from host 2100. For example, memory 2230 stores image data where host 2100 is a digital camera.

In certain embodiments, memory card system 2000 incorporates memory system 1000 of FIG. 11 within memory card 2200. In such embodiments, a bulk voltage $V_{BULK}$ lower than a common source line voltage $V_{CSL}$ is applied to a bulk region of flash memory device 1100 during various operations as described above.

Figure 14:
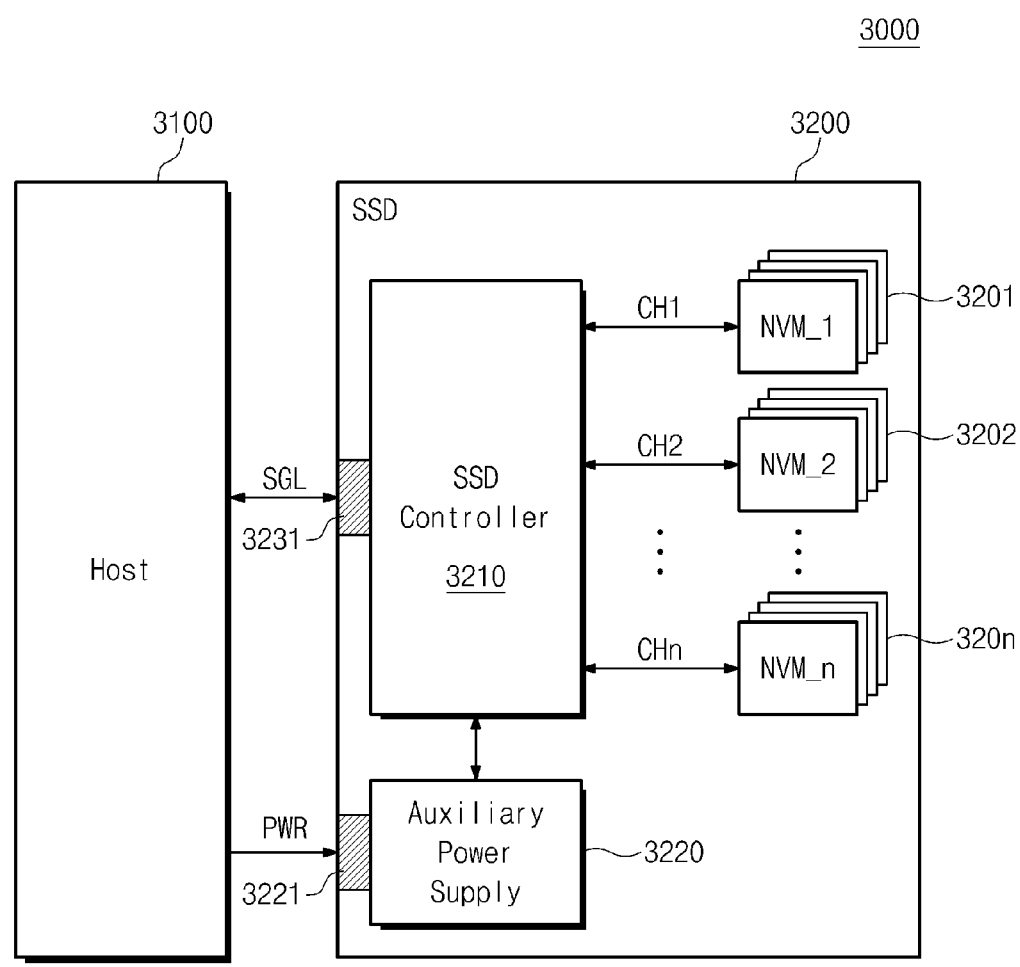
FIG. 14 is a block diagram illustrating a solid state drive (SSD) comprising a flash memory device according to an embodiment of the inventive concept.

FIG. 14 is a block diagram illustrating an SSD system 3000 comprising a flash memory device according to an embodiment of the inventive concept.

Referring to FIG. 14, SSD system 3000 comprises a host 3100 and an SSD 3200. SSD 3200 exchanges signals with host 3100 through a signal connector 3231 and receives a power supply through a power connector 3221. SSD 3200 comprises a plurality of nonvolatile memory devices 3201-320n, an SSD controller 3210, and an auxiliary power supply 3220.

Nonvolatile memory devices 3201-320n are used as a storage medium of SSD 3200. In certain embodiments, nonvolatile memory devices 3201-320n comprise flash memory devices. In other embodiments, nonvolatile memory devices 3201-320n comprise other forms of nonvolatile memory, such as PRAM, MRAM, RRAM, FRAM, or others.

Nonvolatile memory devices 3201-320n are connected to SSD controller 3210 through a plurality of channels CH1-CHn. One or more memory devices are connected to each channel, and memory devices connected to the same channel are connected to the same data bus.

SSD controller 3210 exchanges signals SGL with host 3100 through signal connector 3231. Signals SGL typically comprise commands, addresses, and data. SSD controller 3210 reads and writes data in memory devices according to the commands. An example of the internal structure of SSD controller 3210 will be described with reference to FIG. 15.

Auxiliary power supply 3220 is connected to host 3100 through power supply connector 3221. Auxiliary power supply 3220 charges in response to power PWR provided from host 3100. Auxiliary power supply 3220 can be located inside or outside SSD 3200. In some embodiments, auxiliary power supply 3220 is located on a main board of SSD 3200.

In certain embodiments, SSD system 3000 incorporates memory system 1000 of FIG. 11 within SSD 3200. In such embodiments, a bulk voltage $V_{BULK}$ lower than a common source line voltage $V_{CSL}$ is applied to a bulk region of flash memory device 1100 during various operations as described above.

Figure 15:
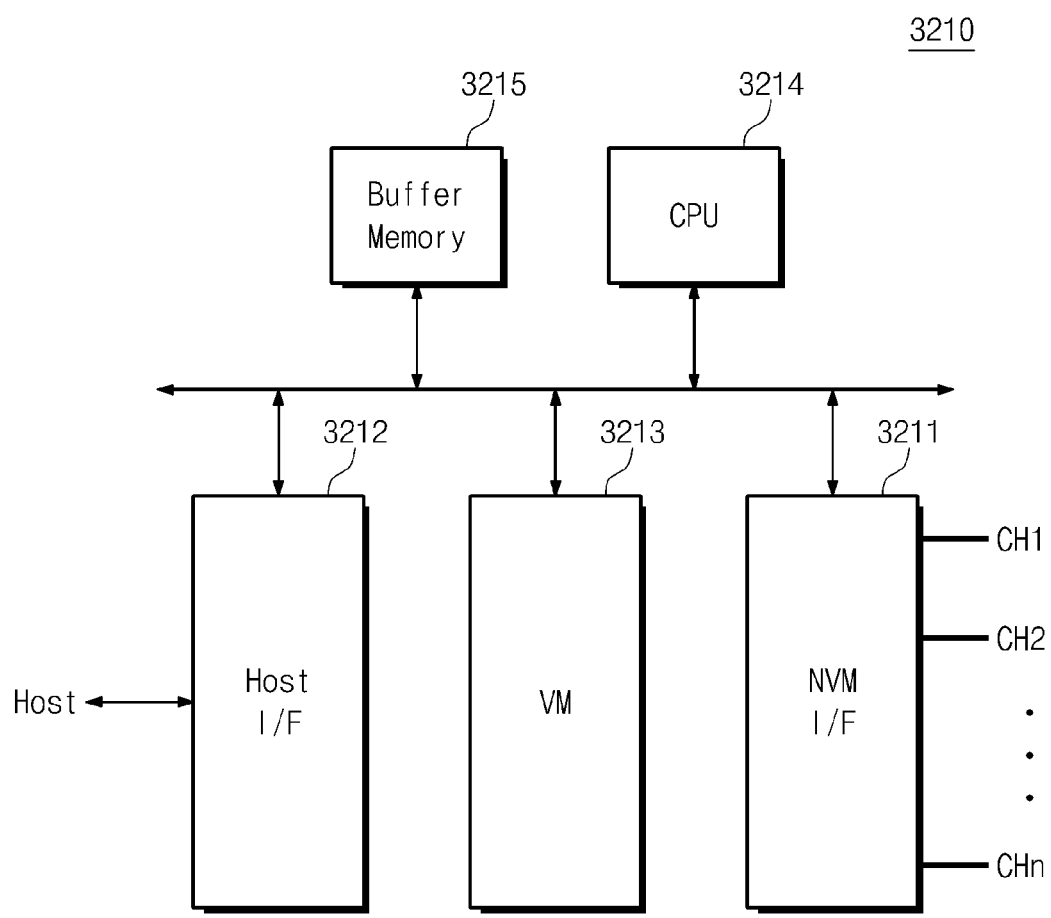
FIG. 15 is a block diagram illustrating an SSD controller illustrated in FIG. 14 according to an embodiment of the inventive concept.

FIG. 15 is a block diagram illustrating an embodiment of SSD controller 3210 of FIG. 14. Referring to FIG. 15, SSD controller 3210 comprises a NVM interface 3211, a host interface 3212, an ECC circuit 3213, a CPU 3214, and a buffer memory 3215.

NVM interface 3211 distributes data transmitted from buffer memory 3215 to channels CH1-CHn. NVM interface 3211 transmits data read from nonvolatile memory devices 3201-320n to buffer memory 3215. NVM interface 3211 typically uses an interface method of a NAND flash memory. Accordingly, SSD controller 3210 typically performs program, read, and erase operations according to the interface method of the NAND flash memory.

Host interface 3212 interfaces with SSD 3200 according to a protocol of the host. For instance, host interface 3212 can communicate with the host using a protocol such as USB, SCSI, PCI express, ATA, parallel ATA, serial ATA, or serial attached SCSI (SAS). Host interface 3212 can perform a disk emulation function so that the host recognizes SSD 3200 as a hard disk drive HDD.

ECC circuit 3213 generates error correction information, such as a parity bit, for data transmitted to nonvolatile memory devices 3201-320n. The generated error correction information is stored in a spare region of nonvolatile memory devices 3201-320n. ECC circuit 3213 uses the error correction information to detect errors in data read from nonvolatile memory devices 3201-320n. Where a detected error is within a correctable range, ECC circuit 3213 corrects the detected error.

CPU 3214 analyzes and processes signals SGL received from the host. CPU 3214 controls the host or nonvolatile memory devices 3201-320n through host interface 3212 or NVM interface 3211. CPU 3214 controls operations of nonvolatile memories 3201-320n according to firmware for driving SSD 3200.

Buffer memory 3215 temporarily stores write data provided from the host or data read from nonvolatile memory devices 3201-320n. Buffer memory 3215 typically stores metadata or cache data to be stored in nonvolatile memory devices 3201-320n. Where a sudden power-off operation is performed, metadata or cache data stored in buffer memory 3215 is stored in nonvolatile memory devices 3201-320n. The buffer memory typically comprises a DRAM or SRAM.

Figure 16:
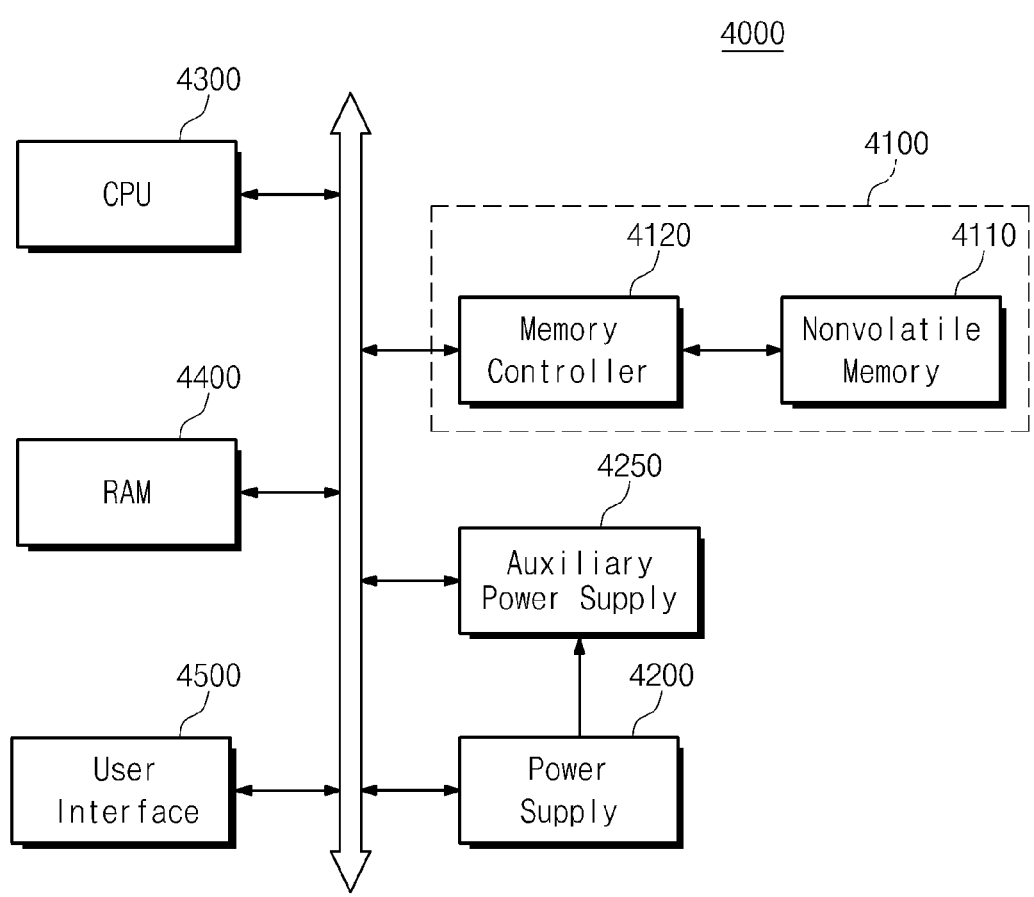
FIG. 16 is a block diagram illustrating an electronic device comprising a flash memory device according to an embodiment of the inventive concept.

FIG. 16 is a block diagram illustrating an electronic device 4000 comprising a flash memory device according to an embodiment of the inventive concept.

Electronic device 4000 can take any of several forms, such as a personal computer, a portable electronic device such as a notebook computer, a cellular phone, a personal digital assistant, and a camera.

Referring to FIG. 16, electronic device 4000 comprises a memory system 4100, a power supply 4200, an auxiliary power supply 4250, a central processing unit 4300, a RAM 4400, and a user interface 4500. Memory system 4100 comprises a flash memory 4110 and a memory controller 4120.

In certain embodiments, electronic device 4000 incorporates memory system 1000 of FIG. 11 as memory system 4100. In such embodiments, a bulk voltage $V_{BULK}$ lower than a common source line voltage $V_{CSL}$ is applied to a bulk region of flash memory 4110 during various operations as described above.

As indicated by the foregoing, in read operations of selected memory cells, leakage currents and short channel effects can be reduced by applying a reduced bulk voltage to respective bulk regions of the selected memory cells. This can increase the swing of corresponding bit line currents in response to read voltages applied to the selected memory cells, allowing the selected memory cells to be read more accuracy. In addition, in program operations of the selected memory cells, a required program voltage can be lowered by applying the reduced bulk voltage to the respective bulk regions of the selected memory cells.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a NAND flash memory device comprising a bulk region and NAND flash string comprising a plurality of memory cells connected in series to a source line and connected in parallel to a plurality of wordlines, respectively, the method comprising:

applying a source line voltage to the source line with a first magnitude;

applying a bulk voltage to the bulk region with a second magnitude lower than the first magnitude; and while applying the bulk voltage to the bulk region and the source line voltage to the source line, applying a select read voltage to a selected wordline among the plurality of wordlines and applying an unselect read voltage to unselected wordlines among the plurality of wordlines;

wherein the bulk voltage has a negative voltage level and a difference in magnitude between the source line voltage and the bulk voltage is between 0V and 2V; and wherein the source line is a common source line of multiple NAND flash strings.

2. The method of claim 1, wherein the bulk voltage is maintained at the same magnitude throughout a read operation.

3. The method of claim 2, wherein the difference in magnitude between the source line voltage and the bulk voltage is between 0V and 1V.

4. The method of claim 1, further comprising determining whether to perform two consecutive read operations on the plurality of memory cells.

5. The method of claim 4, further comprising, upon determining to perform two consecutive read operations on the plurality of memory cells, maintaining a substantially constant voltage difference between the source line voltage and the bulk voltage during the two consecutive read operations.

6. A method of operating a NAND flash memory device comprising a bulk region and NAND flash string comprising a plurality of memory cells connected in series to a source line and connected in parallel to a plurality of wordlines, respectively, the method comprising:

applying a source line voltage to the source line with a first magnitude;

applying a bulk voltage to the bulk region with a second magnitude lower than the first magnitude;

while applying the bulk voltage to the bulk region and the source line voltage to the source line, applying a program voltage to a selected wordline among the plurality of wordlines and applying a pass voltage to an unselected wordline among the plurality of wordlines; and while maintaining a substantially constant difference between the source line voltage and the bulk voltage, applying a verification voltage to the selected wordline and applying an unselect read voltage to the unselected wordlines;

wherein the bulk voltage has a negative voltage level and a difference in magnitude between the source line voltage and the bulk voltage is between 0V and 2V; and wherein the source line is a common source line of multiple NAND flash strings.

7. The method of claim 6, further comprising determining whether selected memory cells connected to the selected wordline have achieved a target program state.

8. The method of claim 7, further comprising, upon determining that the selected memory cells have not achieved the target program state, applying a further program voltage to the selected wordline while maintaining the substantially constant difference between the source line voltage and the bulk voltage.

9. The method of claim 8, further comprising, upon determining that the selected memory cells have achieved the target program state, determining whether a next operation to be performed on the nonvolatile memory device is a program operation.

10. The method of claim 9, further comprising, upon determining that the next operation is a program operation, maintaining the substantially constant difference between the source line voltage and the bulk voltage during the next operation.

11. The method of claim 10, wherein the first magnitude corresponds to a ground voltage.

12. The method of claim 11, wherein the substantially constant difference between the source line voltage and the bulk voltage is about 0.8V.

13. A NAND flash memory device, comprising:

a memory cell array comprising a bulk region and a NAND flash string comprising a plurality of memory cells connected in series to a source line and connected in parallel to a plurality of wordlines, respectively;

a voltage generator that generates a bulk voltage to be applied to the bulk region and a source line voltage to be applied to the source line, wherein the bulk voltage is generated with a lower magnitude than the source line voltage; and a control logic circuit that controls the voltage generator to provide the bulk voltage to the bulk region before providing read voltages, program voltages, or verification voltages to the wordlines during respective read, program, or verification operations;

wherein the bulk voltage has a negative voltage level and a difference in magnitude between the source line voltage and the bulk voltage is between 0V and 2V; and wherein the source line is a common source line of multiple NAND flash strings.

14. The NAND flash memory device of claim 13, wherein the control logic circuit controls the voltage generator to maintain a substantially constant difference between the source line voltage and the bulk voltage in consecutive read operations.

15. The NAND flash memory device of claim 13, wherein the control logic circuit controls the voltage generator to maintain a substantially constant difference between the source line voltage and the bulk voltage during repeated program and verification operations.

16. The NAND flash memory device of claim 13, wherein the control logic circuit controls the voltage generator to maintain a substantially constant difference between the source line voltage and the bulk voltage during transitions from read operations to program and verification operations, and during transitions from program and verification operations to read operations.

17. The NAND flash memory device of claim 13, wherein the source line voltage is a ground voltage, and a voltage difference between the source line voltage and the bulk voltage is between 0V and 1V.

* * * * *